(12) United States Patent
Abe

(10) Patent No.: US 6,599,772 B2
(45) Date of Patent: Jul. 29, 2003

(54) SOLID-STATE PICKUP ELEMENT AND METHOD FOR PRODUCING THE SAME

(75) Inventor: Hideshi Abe, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/826,144

(22) Filed: Apr. 4, 2001

(65) Prior Publication Data

US 2001/0054726 A1 Dec. 27, 2001

(30) Foreign Application Priority Data

Apr. 4, 2000 (JP) ........................ 2000-102412

(51) Int. Cl.$^7$ ............................................ H01L 27/148
(52) U.S. Cl. ......................... 438/78; 438/506; 438/916
(58) Field of Search .......................... 438/60, 75, 76, 438/78, 505, 506, 916, FOR 255

(56) References Cited

U.S. PATENT DOCUMENTS

| | | | | |
|---|---|---|---|---|
| 4,573,257 A | * | 3/1986 | Hulseweh | 148/DIG. 102 |
| 5,404,039 A | * | 4/1995 | Watanabe | 257/223 |
| 5,619,049 A | * | 4/1997 | Kim | 257/223 |
| 5,898,195 A | * | 4/1999 | Harada | 257/223 |
| 6,351,001 B1 | * | 2/2002 | Stevens et al. | 257/223 |
| 6,403,994 B1 | * | 6/2002 | Wada | 257/223 |

FOREIGN PATENT DOCUMENTS

| | | | | |
|---|---|---|---|---|
| JP | 2000049326 A | * | 2/2000 | H01L/21/339 |

* cited by examiner

Primary Examiner—George Fourson
Assistant Examiner—Suk-San Foong
(74) Attorney, Agent, or Firm—Sonnenschein, Nath & Rosenthal

(57) ABSTRACT

A solid-state pickup element achieves both improvement in sensitivity and reduction of pixel size and a method thereof, includes a first conductive type semiconductor area, which is formed at least so as to include the inside of the semiconductor substrate upward of the overflow barrier area inside the semiconductor substrate, and a charge accumulating area at the position corresponding to the first conductive type semiconductor area of the light receptive sensor part in the epitaxial layer on the semiconductor substrate. An overflow barrier area is formed in the semiconductor substrate, and the first conductive type semiconductor area is formed on the surface, respectively, wherein an epitaxial layer is formed on the semiconductor substrate, and a charge accumulating area is formed at the position corresponding to the first conductive type semiconductor area on the surface side of the epitaxial layer, thereby producing a solid-state pickup element.

16 Claims, 11 Drawing Sheets

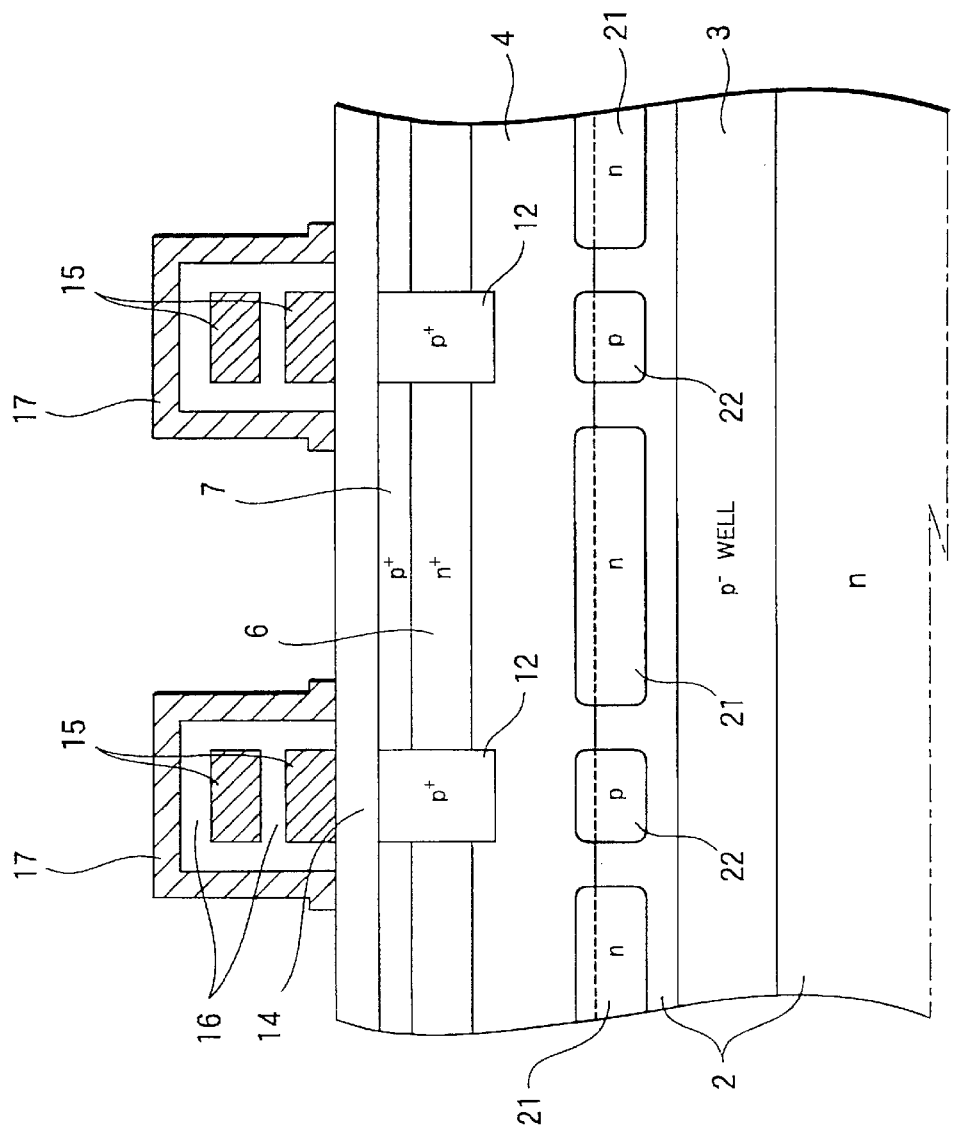

SOLID-STATE PICKUP ELEMENT AND METHOD FOR PRODUCING THE SAME

DETAILED DESCRIPTION OF THE INVENTION RELATED APPLICATION DATA

The present application claims priority to Japanese Application No. P2000-102412 filed Apr. 4, 2000, which application is incorporated herein by reference to the extent permitted by law.

FIELD OF THE INVENTION

The present invention relates to a solid-state pickup element employing a vertical type overflow drain structure in, for example, a CCD solid-state pickup element, etc., and a method for producing the solid-state pickup element.

BACKGROUND OF THE INVENTION

A solid-state pickup element of a so-called vertical type overflow drain structure, in which surplus charge is discharged to the substrate side at a light receptive sensor part, has been publicly known as a solid-state pickup element.

A solid-state pickup element has been proposed which has sensitivity in a near-infrared ray area by deeply forming a charge collecting area of a light receptive sensor part in a solid-state pickup element of a vertical type overflow drain system like this.

A general configurational view (cross-sectional view) of such a CCD solid-state pickup element having sensitivity in a near-infrared ray area is shown in FIG. 11.

The CCD solid-state pickup element 51 is such that the first semiconductor well area 53 of the second conductive type, that is, a p-type, which becomes an overflow barrier area, is formed on a semiconductor substrate 52 made of the first conductive type, that is, an n-type silicon, and a high resistance area 54 having high specific resistance such as, for example, p⁻area, non-doped area, n⁻area, etc., is formed on the semiconductor substrate 52 on which the first p-type semiconductor well area 53 is formed.

An n⁺ semiconductor area 56 that constitutes respective matrix-arrayed light receptive sensor parts 55 is formed on the surface of the high resistance area 54, and a p+ positive charge accumulating area 57 is also formed thereabove. The p⁺ positive charge accumulating area 57 prevents a dark current from occurring due to a phase boundary level. The n⁺ semiconductor area 56 becomes a so-called charge accumulating area. An n⁻ semiconductor area 70 having a denser concentration than that of the high resistance area, which will become a charge collecting area reaching the first p-type semiconductor well area, which is so-called overflow barrier area 53, from the n⁺ semiconductor area 56, is formed on the high resistance area 54 below the n⁺ semiconductor area 56. An area where photo-electric conversion of the light receptive sensor part 55 is carried out includes the n⁺ semiconductor area 56 and the n⁻ semiconductor area 70 before the overflow barrier area 53 of a depletion layer extending from the n⁺ semiconductor area 56 downward of the substrate.

An n-type embedded transfer channel area 60 of a vertical transfer register 59 is formed at the position corresponding to one side of the respective light receptive sensor part row of the high resistance area 54 so that a reading gate part 58 is placed between the same and the p+ positive charge accumulating area 57. Also, the second p-type semiconductor well area 61 is formed so as to surround the embedded transfer channel area 60. Further, a p-type channel stop area 62 is formed, which sections respective pixels including the light receptive sensor part 55.

A transfer electrode 65 made of, for example, polycrystalline silicon is formed on the embedded transfer channel area 60, channel stop area 62, and reading gate part 58 via a gate insulation film 64. The vertical transfer register 59 of a CCD structure is constructed of the embedded transfer channel area 60, gate insulation film 64, and transfer electrode 65.

A light shielding film 67 made of, for example, Al is formed on the entire surface excluding an opening of the light receptive sensor part 55 via an interlayered insulation film 66 that shields the transfer electrode 65. Light is made incident into the light receptive sensor part 55 via the opening of the light shielding film 67, and the light can be prevented from incidence into parts other than the light receptive sensor part 55 by the light shielding film 67.

Further, although not illustrated, a flattening film, a color film, on-chip lens, etc., are formed, thereby constituting a CCD solid-state pickup element 51.

And, in the above-described structure, as a method for improving the sensitivity with respect to a longer wavelength, as disclosed in, for example, Japanese Patent Laid-Open No. 331058/1997, a method has been proposed which deeply widens the charge collecting area 70 by causing a silicon epitaxial film of a low impurity concentration to thickly grow on the upper layer of the first p-type well area 53 as the high resistance area 54 of FIG. 11 in order to form an overflow barrier area at a deeper position.

Herein, in order to introduce electrons, which are photoelectrically converted at a deeper position from the surface, to the surface of the light receptive sensor part 55, it is necessary that the potential is inclined toward the surface side in a depletion layer between an n+ semiconductor area 56 that constitutes a photo diode of the light receptive sensor part 55 and a p-type semiconductor well area 53 that constitutes an overflow barrier.

Conventionally, the sensitivity with respect to a longer wavelength has been achieved by making the charge collecting area 70 into a low concentration area (n⁻).

Further, since, at the semiconductor area 54B downward of the second p⁺ semiconductor well area 61 that constitutes the vertical transfer register 59, inclination that is inverse of the light receptive sensor part 55 is formed to be potentially continuous with the first p⁺ type semiconductor well area 53, which is positioned further downward thereof, such a profile is provided, in which electrons flow in the direction of the substrate 52.

Therefore, as the pixel size becomes small, the low concentration area, that is, the charge collecting area 70 is subjected to three-dimensional potential modulation from the above-described semiconductor area 54B, whereby the overflow barrier will move to the surface side.

Resultantly, such a situation occurs, where no sensitivity is provided with respect to the longer wavelength side.

To suppress the situation, it is necessary to form the n⁺ semiconductor area 56 of the light receptive sensor part 55 further closer to the first p-type semiconductor well area 53.

Therefore, ion injection of high energy will be required.

However, in the present situation, there exists no equipment that can inject electrons with energy that is more than 3.2 Mev.

SUMMARY OF THE INVENTION

Therefore, where P (phosphor) is injected with energy of 3.2 MeV at maximum, the projection range Rp becomes Rp=2.6 $\mu$m+$\Delta$Rp=0.3 $\mu$m, wherein the n⁺ semiconductor area 56 can be formed at only a depth of 3 $\mu$m in total.

Accordingly, the pixel size cannot be reduced further.

In order to solve the above-described problem, it is therefore an object of the invention to provide a solid-state pickup element that is capable of achieving improvement of the sensitivity and reducing the size thereof, and a method for producing the same.

A solid-state pickup element according to the invention is constructed so that an overflow barrier area is formed in a semiconductor substrate, an epitaxial layer is formed on the semiconductor substrate, a first conductive type semiconductor area, which widens a charge collecting area upward of the overflow barrier area, is formed so as to include at least the inside of the semiconductor substrate, and a charge accumulating area of a light receptive sensor part is formed at the position corresponding to the first conductive type semiconductor area of the epitaxial layer.

A method for producing the solid-state pickup element according to the invention includes the steps of forming an overflow barrier area in a semiconductor substrate, forming the first conductive type semiconductor area on the surface of the semiconductor substrate, forming an epitaxial layer on the semiconductor substrate, and forming the first conductive type charge accumulating area at the position corresponding to the first conductive type semiconductor area on the surface side of the epitaxial layer.

According to one of the aspects of the above-described solid-state pickup element of the invention, since the first conductive type semiconductor area is formed upward of the overflow barrier area, it will become possible to widen the charge collecting area to the vicinity of the overflow barrier area by the first conductive type semiconductor area. Since the first conductive type semiconductor area is formed so as to include at least the inside of the semiconductor substrate, it becomes possible to widen the charge collecting area to a deep position in the vicinity of the overflow barrier area formed in the semiconductor substrate.

And, since the charge accumulating area of the light receptive sensor part is formed at the position corresponding to the first conductive type semiconductor area, it is possible to accumulate charge photo-electrically converted by utilizing a deep charge collecting area in the light receptive sensor part.

According to the above-described method of the invention, since it includes the steps of forming the first conductive type semiconductor area on the surface of the semiconductor substrate and forming an epitaxial layer on the semiconductor substrate, the first conductive type semiconductor area can be formed at a deep position corresponding to the thickness of the epitaxial layer, wherein it is possible to construct a charge collecting area that is widened to a deep position.

And, since the first conductive type charge accumulating area is formed at the position corresponding to the first conductive type semiconductor area at the surface side of the epitaxial layer, it is possible to form a charge accumulating area in a deep charge collecting area.

According to the invention described above, it becomes possible to widen the charge collecting area close to the overflow barrier area by the first conductive type semiconductor area.

Thereby, since charge photo-electrically converted by utilizing a deep charge collecting area can be accumulated in the light receptive sensor part, conventionally wasted charge can be collected, and the sensitivity can be improved.

In addition, the thicker the epitaxial layer becomes, the deeper the first conductive type semiconductor area is formed, wherein the charge collecting area is widened, and satisfactory sensitivity can be brought about with respect to light of longer wavelength.

That is, it becomes possible to improve the sensitivity of light of a longer wavelength side and to improve the sensitivity of visible light.

Since the charge collecting area can be deepened without deeply forming the first conductive type semiconductor area of the light receptive sensor part, it is possible to prevent the overflow barrier from moving to the surface side in a case where the pixel size is made small.

Therefore, with the present invention, it is possible to improve the sensitivity of a solid-state pickup element and to reduce the pixel size.

BRIEF DESCRIPTION OF THE DRAWINGS

FIG. 10 is a sectional view showing the case where the second channel stop area is formed on the CCD solid-state pickup element of FIG. 1.

DETAILED DESCRIPTION OF EMBODIMENTS OF THE INVENTION

The present invention provides a solid-state pickup element which is constructed so that an overflow barrier area is formed in the semiconductor substrate, an epitaxial layer is formed on the semiconductor substrate, the first conductive type semiconductor area that widens the charge collecting area is formed upward of the overflow barrier area so as to include at least the inside of the semiconductor substrate, and the charge accumulating area of the light receptive sensor part is formed at the position corresponding to the first conductive type semiconductor area of the epitaxial layer.

Also, the invention is constructed so that, in the above-described solid-state pickup element, the semiconductor substrate includes a semiconductor substrate and an epitaxial layer on the semiconductor substrate.

The invention provides a method for producing a solid-state pickup element, which includes the steps of forming an overflow barrier area inside a semiconductor substrate, forming a first conductive type semiconductor area on the surface of the semiconductor substrate, forming an epitaxial layer on the semiconductor substrate, and forming a first conductive type charge accumulating area at the position corresponding to the first conductive type semiconductor area on the surface side of the epitaxial layer.

Figure 1:
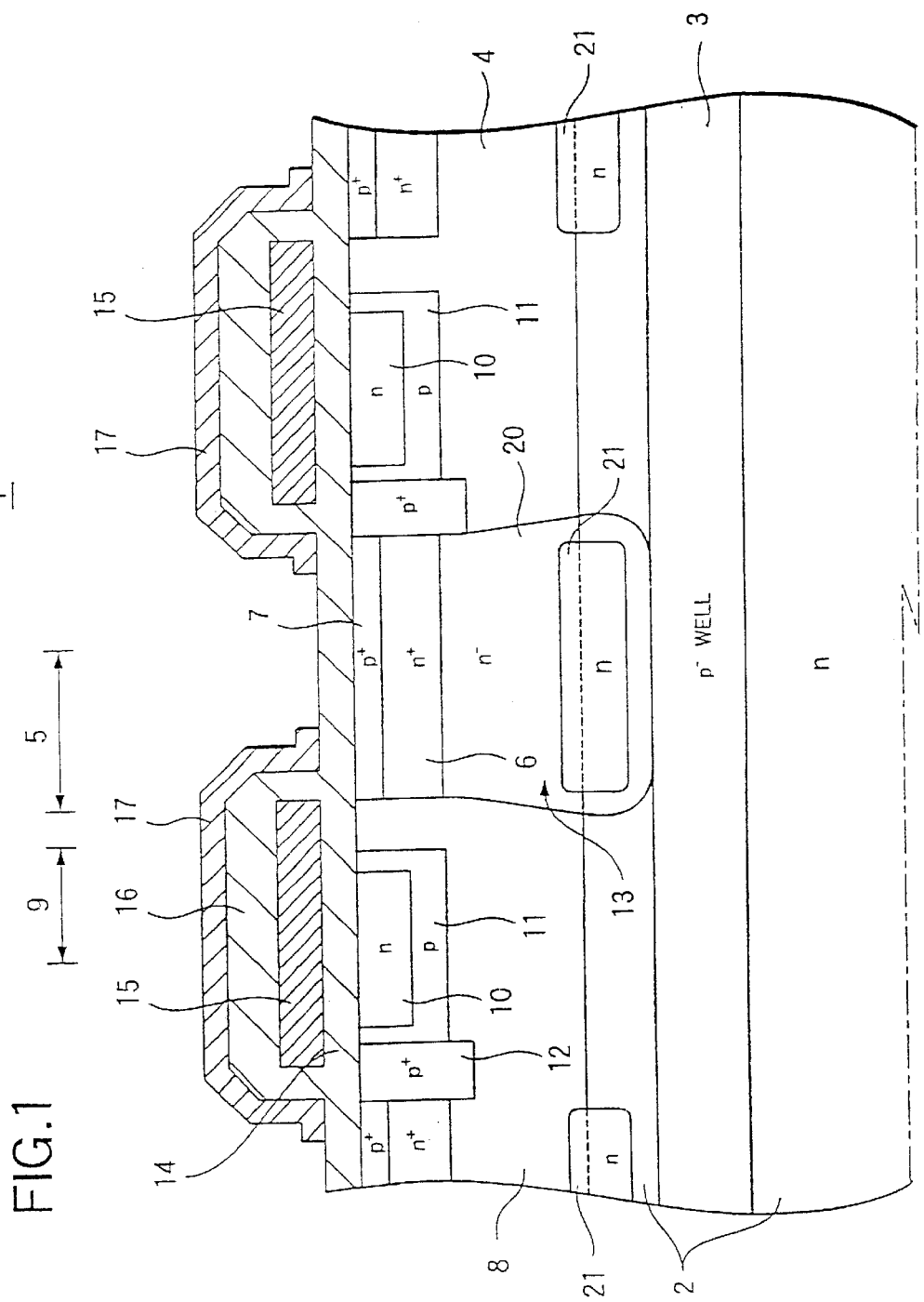
FIG. 1 is a general configurational view (sectional view) of a CCD solid-state pickup element according to one embodiment of the invention.

FIG. 1 shows a general configurational view (sectional view) of a CCD solid-state pickup element according to one embodiment of the invention.

In the CCD solid-state pickup element 1, the second conductive type, that is, p-type first semiconductor well area 3, that will become an overflow barrier area, is formed at a deep position of the first conductive type, for example, n-type semiconductor substrate 2 consisting of silicon.

Also, an epitaxial layer 4 that constitutes a high resistance area of high specific resistance such as, for example, a p⁻area, non-doped area, and n⁻area, etc., is formed on the semiconductor substrate 2.

In order to constitute respective matrix-arrayed light receptive sensor parts 5 on the surface of the epitaxial layer 4, the first conductive type n⁺ semiconductor area 6 is formed, and a p⁺ positive charge accumulating area 7 is formed thereon. The p⁺ positive charge accumulating area 7 prevents a dark current resulting from the phase boundary level from occurring. The n⁺ semiconductor area 6 will become a so-called charge accumulating area.

In the epitaxial layer 4 below the n⁺ semiconductor area 6, an n⁻ semiconductor area 20, having a thicker concentration than that of the epitaxial layer 4, which becomes a charge collecting area reaching the first p-type semiconductor well area, so-called overflow barrier area 3 from the n⁺ semiconductor area 6, is formed.

An n-type embedded transfer channel area 10 of a vertical transfer register 9 is formed at the position corresponding to one side of the respective light receptive sensor part row of the epitaxial layer 4 so that a reading gate part 8 is disposed between the channel area 10 and the positive charge accumulating area 7. The second p-type semiconductor well area 11 is formed so as to surround the embedded transfer channel 10. Further, an p-type channel stop area 12 that sections respective pixels including the light receptive sensor part 5 is formed.

A transfer electrode 15 made of, for example, polycrystalline silicon is formed on the embedded transfer channel area 10, channel stop area 12 and reading gate part 8 via a gate insulation film 14, and the vertical transfer register 9 of a CCD structure is constructed of the embedded transfer channel area 10, gate insulation film 14, and transfer electrode 15. A light shielding film 17 made of, for example, Al is formed on the entire surface at the other part excluding an opening of the light receptive sensor part 5 via an interlayered insulation film 16 that shields above the transfer electrode 15.

Further, although not illustrated, a flattening film, a color filter, on-chip lens, etc., are formed, thereby constituting a CCD solid-state pickup element 1.

In the embodiment, in particular, an n-type semiconductor area 21 is additionally formed at the position in the n⁻ semiconductor area 20 upward of the first p-type semiconductor well area 3, which becomes the overflow barrier area, deeper than the n⁺ semiconductor area 6 that becomes the charge accumulating area of the light receptive sensor part 5.

The n-type semiconductor area 21 is formed so as to include the inside of the semiconductor substrate 2 in the mode of stretching over the epitaxial layer 4 on the semiconductor substrate 2.

The concentration of the n-type semiconductor area 21 is thinner than that of the n⁺ semiconductor area 6 of the light receptive sensor part 5 and is such a concentration that is at least not more than the half of the concentration of, for example, the n⁺ semiconductor area 6, but it is maintained at a thicker concentration than that of the n⁻ semiconductor area 20. The reason is that since charge cannot be read unless the area where charge is accumulated is located at the same position of the n⁺ semiconductor area 6 as in the prior art, the concentration is set so that the potential profile slowly rises from the n-type semiconductor area 21 toward the n⁺ semiconductor area 6.

The area photo-electrically converted by the light receptive sensor part 5 includes the n⁺ semiconductor area 6, the n⁻ semiconductor area 20 before the overflow barrier area 3 of the depletion layer extending downward of the substrate from the n⁺ semiconductor area 6, and the n-type semiconductor area 21.

According to the embodiment, since the n-type semiconductor area 21 is formed upward of the overflow barrier area 3, the charge collecting area 13 can be widened to the vicinity of the overflow barrier area 3 by the n-type semiconductor area 21.

Also, since the n-type semiconductor area 21 is formed to include the inside of the semiconductor substrate 2, it is possible to widen the charge collecting area 13 to a deep position in the vicinity of the overflow barrier area 3 formed inside the semiconductor substrate 2 regardless of the thickness of the epitaxial layer 4 formed on the semiconductor substrate 2.

And, since n⁺ semiconductor area 6 that becomes a charge accumulating area of the light receptive sensor part 5 is formed at the position corresponding to the first conductive type semiconductor area, charge photo-electrically converted by utilizing the deep charge collecting area 13 can be accumulated in the light receptive sensor part 5.

Therefore, since it is possible to collect conventionally wasted charge, the sensitivity can be improved.

Further, the thicker the epitaxial layer 4 becomes, the deeper the n-type semiconductor area 21 can be formed. Therefore, the charge collecting area 13 can be deeply widened to improve the sensitivity, and at the same time, satisfactory sensitivity can be maintained with respect to light of a longer wavelength.

For example, if the n-type semiconductor area 21 is formed by 4 through 5 $\mu$m deep from the phase boundary between the gate insulation film 14 and the epitaxial layer 4, the sensitivity for visible light (wavelength ranging from 400 nm through 700 nm) can be improved.

In addition, if the thickness of the epitaxial layer 4 is made into approx. 10 $\mu$m, the overflow barrier becomes 10 $\mu$m or deeper, satisfactory sensitivity can be brought about with respect to near-infrared rays.

By setting the thickness and concentration of the epitaxial layer 4 and those of the p-type semiconductor well area 3 and n-type semiconductor area 21, it is possible to form a CCD solid-state pickup element 1 having desired characteristics.

Still further, it becomes possible to deepen the charge collecting area 13 and also to deepen the overflow barrier by the n-type semiconductor area 21 without deeply forming the n⁺ semiconductor area 6 of the light receptive sensor part 5. Therefore, where the pixel size is made small, it is possible to suppress movement of the overflow barrier position to the surface side.

Therefore, it is possible to attempt the reduction of the pixel size of the CCD solid-state pickup element 1.

The CCD solid-state pickup element 1 according to the above-described embodiment can be produced as shown below.

Figure 2A:
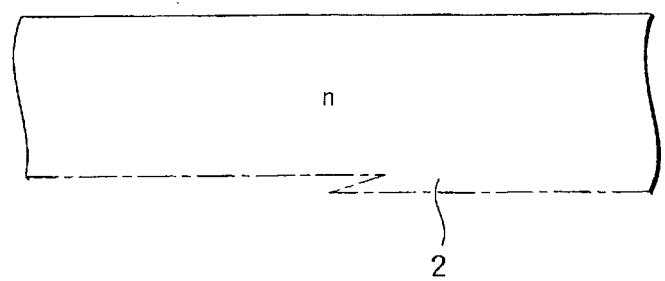
FIG. 2A through FIG. 2C are views showing the processes of producing the CCD solid-state pickup element of FIG. 1.

First, as shown in FIG. 2A, a semiconductor substrate 2 made of, for example, n-type silicon is prepared.

Figure 2B:
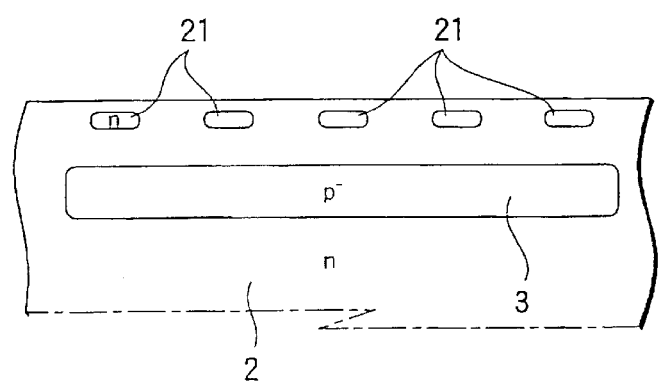

Next, as shown in FIG. 2B, by ion-injection of, for example, B (Boron) into the semiconductor substrate 2, a p-type semiconductor well area 3 is formed, which will become an overflow barrier area.

Also, an n-type semiconductor area 21 is formed by ion-injection of, for example, As (Arsenic) or P (Phosphor) near the surface of the semiconductor substrate 2 upward of the p-type semiconductor well area 3. The n-type semiconductor area 21 is formed so as to correspond to the portion that will become a light receptive sensor part 5 later.

At this time, the sequence of ion injection into the p-type semiconductor well area 3 and n-type semiconductor area 21 does not matter.

Figure 2C:
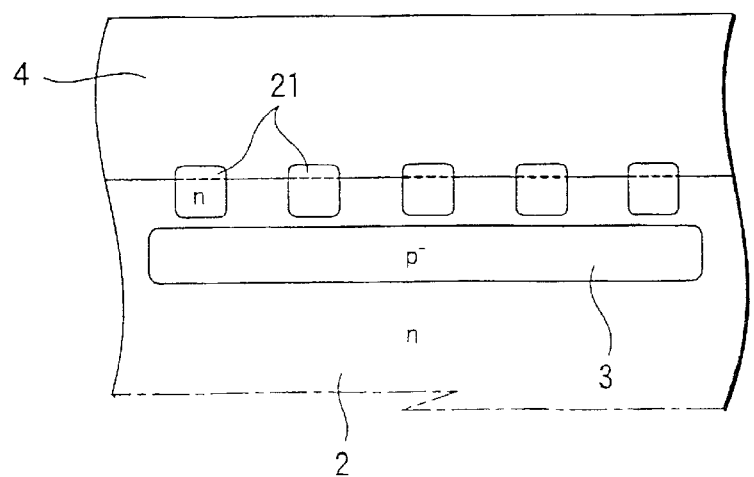

Subsequently, as shown in FIG. 2C, silicon epitaxial growth of low impurity concentration is performed on the semiconductor substrate 2, whereby the epitaxial layer 4 is formed to be, for example, 10 µm thick.

Since a more satisfactory impurity profile can be formed by lowering the film forming temperature in the epitaxial growth, it is favorable that the film forming temperature is not more than 1100° C. More favorably, the film forming temperature is set at not more than 1050° C.

In this connection, since the epitaxial growth has been frequently performed at a high temperature, B (Boron) of the first p-type semiconductor well area 3 is diffused, and As (Arsenic) or P (Phosphor) of the n-type semiconductor area 21 is also diffused by heat-treatment, wherein the n-type semiconductor area 21 is diffused so as to stretch over the epitaxial layer 4.

Therefore, it is necessary that the first p-type semiconductor well area 3 is deeply formed so that it is positioned at a more shallow position than the first p-type semiconductor well area 3 after the n-type semiconductor area 21 is diffused.

Thereafter, a semiconductor area, which constitutes a light receptive sensor part 5 and a vertical transfer register 9, etc., is formed by ion-injection into the epitaxial layer 4, and a gate insulation film 14, transfer electrode 15 and light shielding film 17 are formed one after another upward of the epitaxial layer 4.

Herein, an n$^+$ semiconductor area (charge accumulating area) 6 and a p$^+$ positive charge accumulating area 7, which constitute the light receptive sensor part 5, are formed at the position corresponding to the n-type semiconductor area 21 on the surface side of the epitaxial layer 4. Since the subsequent process is similar to that of prior arts, overlapping description thereof is omitted herein.

Thus, it is possible to produce a CCD solid-state pickup element 1 shown in FIG. 1.

Since the method for producing a solid-state pickup element includes the steps of forming an n-type semiconductor area 21 on the surface of the semiconductor substrate 2 and forming an epitaxial layer 4 on the semiconductor substrate 2, it is possible to form the n-type semiconductor area 21 at a deep position responsive to the thickness of the epitaxial layer 4, and the charge collecting area 13 can be constructed so as to be widened to the deep position.

Since an n$^+$ semiconductor area 6 that becomes a charge accumulating area is formed at the position corresponding to the n-type semiconductor area 21 on the surface side of the epitaxial layer 4, it is possible to form a charge accumulating area on the deep charge collecting area 13.

Also, where the film forming temperature of the epitaxial layer 4 is further lowered, the n-type semiconductor area 21 may remain the semiconductor substrate 2 even if it is further diffused.

Figure 3:
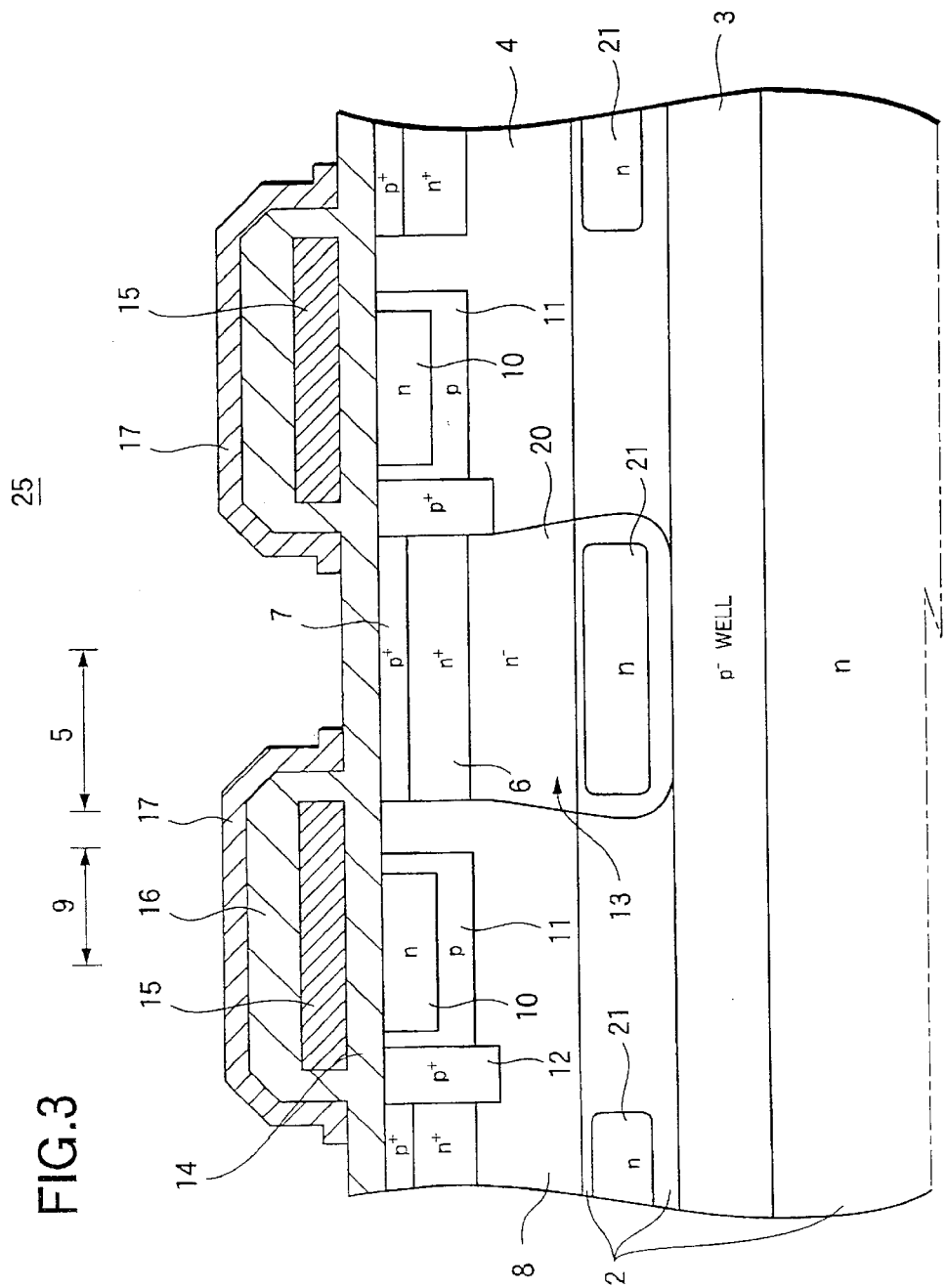
FIG. 3 is a general configurational view (sectional view) of a modified mode of the CCD solid-state pickup element of FIG. 1.

Therefore, in this case, a CCD solid-state pickup element 25 as shown in the sectional view of FIG. 3 can be formed.

Continuously, a description is given of another embodiment of the invention.

The embodiment refers to a mode in which a semiconductor substrate is constructed of a semiconductor substrate and an epitaxial layer formed thereon, and an n-type area that widens the charge collecting area is formed on the semiconductor substrate.

Figure 4:
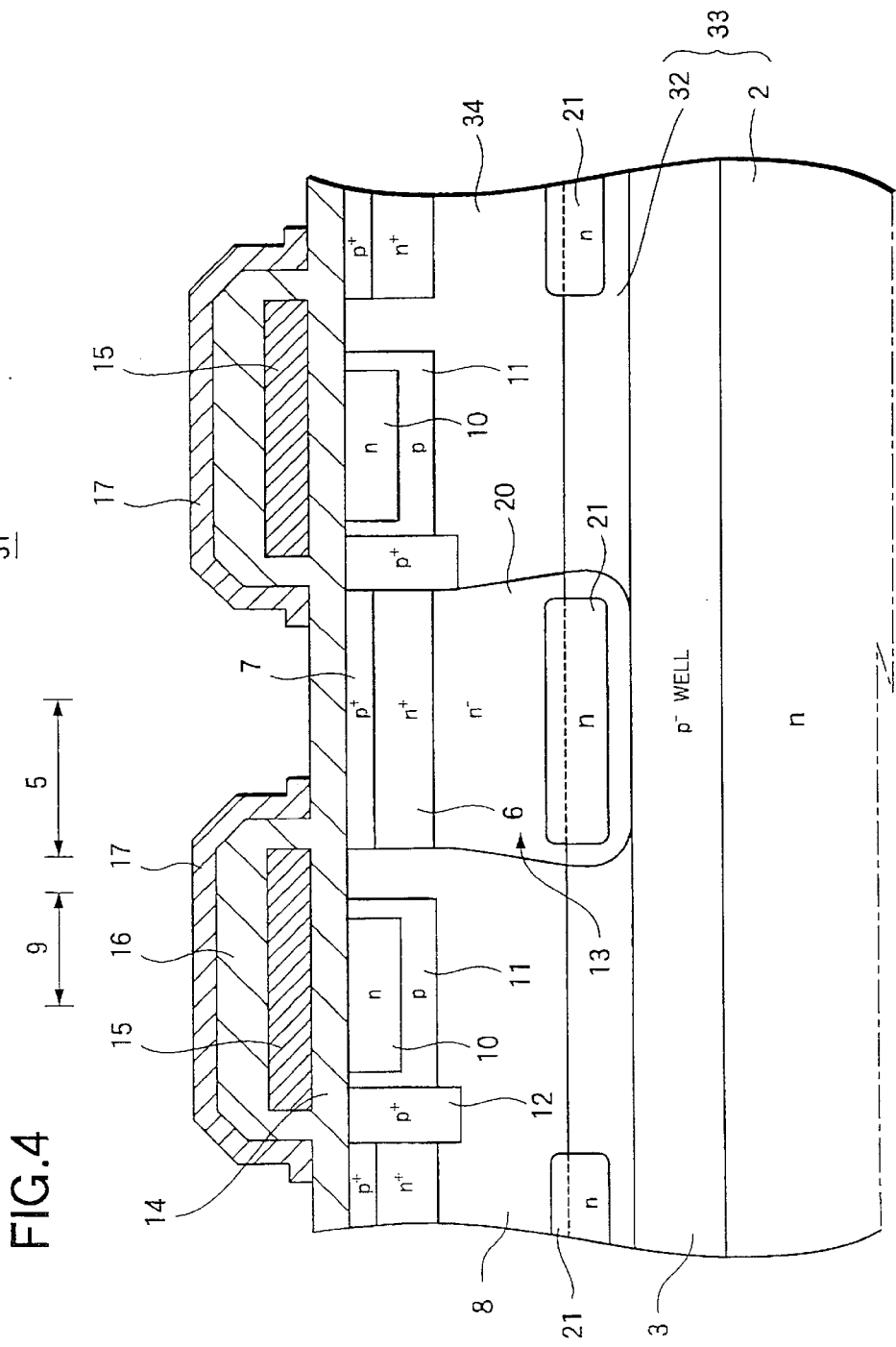
FIG. 4 is a general configurational view (sectional view) of a CCD solid-state pickup element according to another embodiment of the invention.

FIG. 4 shows a general configurational view (sectional view) of a CCD solid-state pickup element according to this embodiment.

The CCD solid-state pickup element 31 is such that a p-type semiconductor well area 3, which becomes an overflow barrier area, is formed inside the semiconductor substrate 33 constituted so that the first epitaxial layer 32 is formed on the semiconductor substrate 2.

In addition, actually, the p-type semiconductor well area 3 is formed in the vicinity of the surface of the semiconductor substrate 2 (Refer to FIG. 5).

Further, the second epitaxial layer 34 is formed on the semiconductor substrate 33.

An n$^+$ semiconductor area 6 and p$^+$ positive charge accumulating area 7, which constitute the light receptive sensor part 5, and an embedded channel area 10 and a second p-type semiconductor well area 11, which constitute a vertical transfer register 9, are formed inside the second epitaxial layer 34.

And, the n-type semiconductor area 21 is formed below the n$^+$ semiconductor area 6 of the light-receptive sensor part 5 in the mode of stretching over the first epitaxial layer 32 of the semiconductor substrate 33 and the second epitaxial layer 34 thereon.

The n-type semiconductor area 21 is formed upward of the p-type semiconductor well area 3 that becomes the overflow barrier.

Since the other construction is similar to that of the CCD solid-state pickup element of FIG. 1, the same reference numbers are given, and overlapping description thereof is omitted.

According to the CCD solid-state pickup element 31 of the embodiment, since the n-type semiconductor area 21 is formed below the n$^+$ semiconductor area 6, which becomes a charge accumulating area of the light receptive sensor part 5, so as to stretch over the first epitaxial layer 32 of the semiconductor substrate 33 and the second epitaxial layer 34 thereon, it is possible to widen the charge collecting area 13 deeply to the semiconductor substrate 33 as in the CCD solid-state pickup element 1 of the preceding embodiment.

Therefore, conventionally wasted charge that has been photo-electrically converted in a deep position can be accumulated in the charge accumulating area, and the sensitivity can be improved.

Further, it is possible to attempt to reduce the pixel size of the CCD solid-state pickup element 31.

A CCD solid-state pickup element 31 according to the embodiment can be produced as shown below.

Figure 5A:
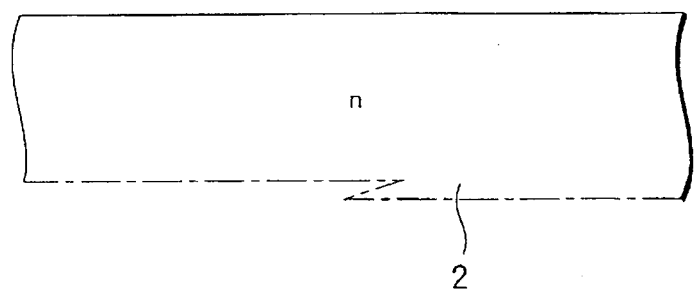
FIG. 5A through FIG. 5C are views showing the processes of producing the CCD solid-state pickup element of FIG. 4.

First, as shown in FIG. 5A, a semiconductor substrate 2 made of, for example, n-type silicon is prepared.

Figure 5B:
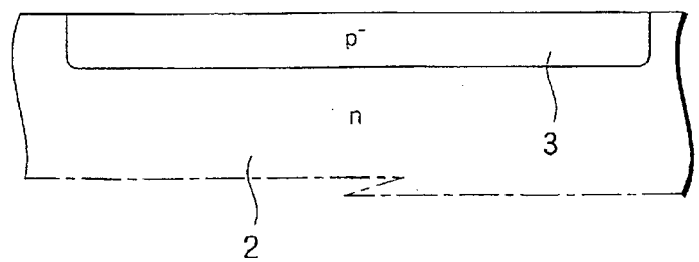

Next, as shown in FIG. 5B, by ion-injection of, for example, B (Boron) in the vicinity of the surface of the semiconductor substrate 2, a p-type semiconductor well area 3 is formed, which will become an overflow barrier area.

Figure 5C:
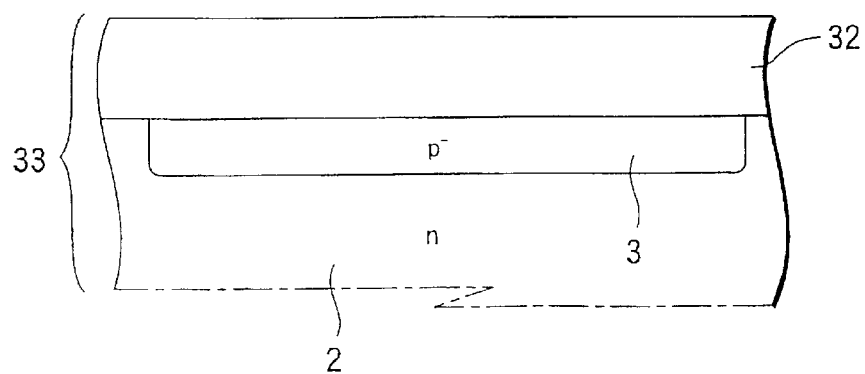
Figure 6D:
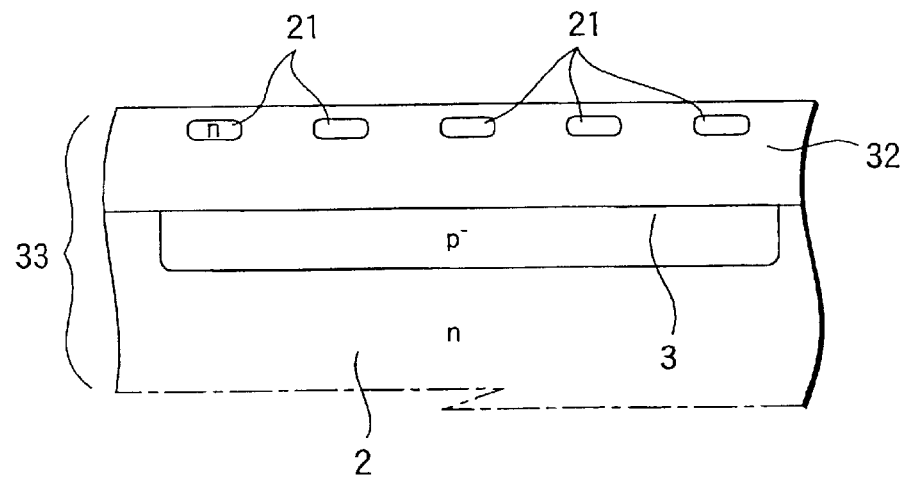
FIG. 6D and FIG. 6E are views showing the processes of producing the CCD solid-state pickup element of FIG. 4.

Continuously, as shown in FIG. 5C, the first epitaxial layer 32 is formed on a semiconductor substrate 2, whereby a semiconductor substrate 33 including the semiconductor substrate 2 and the first epitaxial layer 32, in which a p-type semiconductor well area 3 is formed, is constructed. Next, as shown in FIG. 6D, an n-type semiconductor area 21 is formed by ion-injection of, for example, P (Phosphor) in the vicinity of the surface of the semiconductor substrate 33, that is, in the vicinity of the first epitaxial layer 32.

Figure 6E:
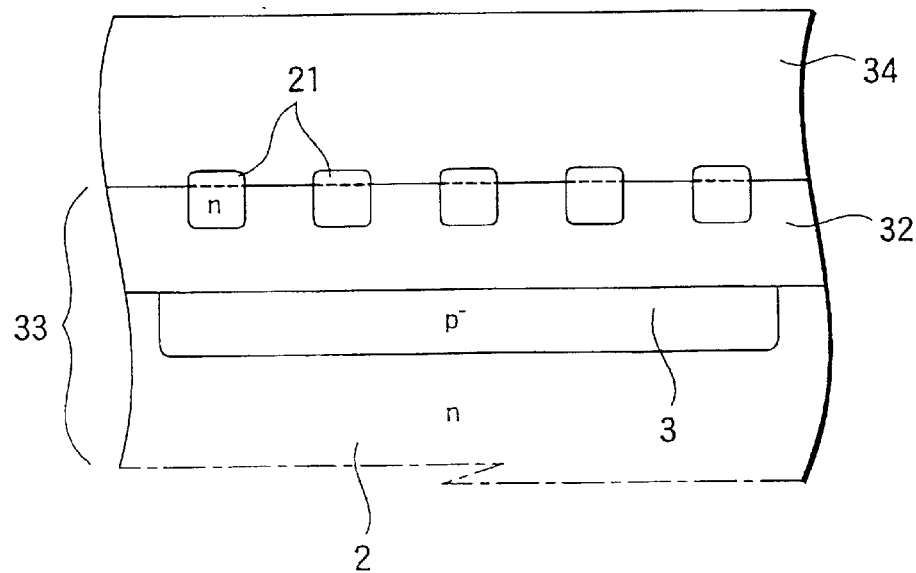

Also, as shown in FIG. 6E, the second epitaxial layer 34 is formed on the semiconductor substrate 33. At this time, the n-type semiconductor area 21 is diffused so as to stretch over the second epitaxial layer 34.

However, where the film forming temperature of the second epitaxial layer 34 is lowered, the n-type semiconductor area 21 may remain in the semiconductor substrate 34 even if it is diffused.

Thereafter, an area, in which a light receptive sensor part 5, a vertical transfer register 9, etc., are constituted by ion-injection, is formed on the second epitaxial layer 34, and by forming a transfer electrode 15 and a light shielding film 17, etc., upward of the second epitaxial layer 34, it is possible to produce the CCD solid-state pickup element 31 shown in FIG. 4.

Subsequently, a description is given of still another embodiment of the invention.

The embodiment relates to a case where a semiconductor substrate is constructed of a semiconductor substrate and an epitaxial layer formed thereon, and an n-type area to widen a charge collecting area is formed on the semiconductor substrate. However, the embodiment differs from the CCD solid-state pickup element 31 shown in FIG. 4 in that the overflow barrier area is formed in the epitaxial layer.

Figure 7:
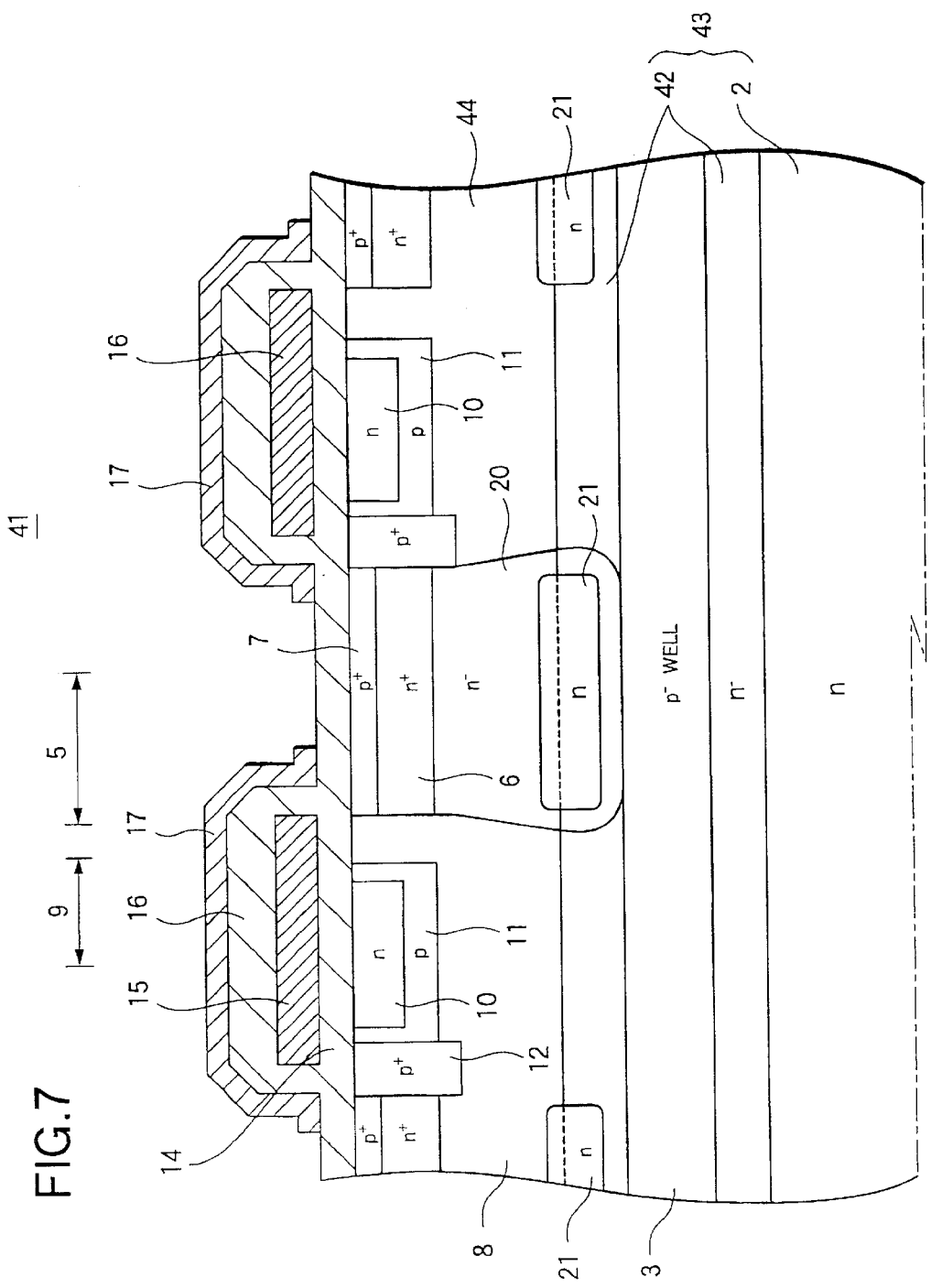
FIG. 7 is a general configurational view (sectional view) of a CCD solid-state pickup element according to still another embodiment of the invention.

FIG. 7 shows a general configurational view (sectional view) of a CCD solid-state pickup element according to the embodiment of the invention.

The CCD solid-state pickup element 41 is such that a p-type semiconductor well area 3, which becomes an overflow barrier area, is formed inside the semiconductor substrate 43 constructed by forming the first epitaxial layer 42 on the semiconductor substrate 2. The p-type semiconductor well area 3 is formed inside the first epitaxial layer 42.

In addition, the second epitaxial layer 44 is formed on the semiconductor substrate 43.

In the second epitaxial layer 44, an $n^+$ semiconductor area 6 and a $p^+$ positive charge accumulating area 7, which constitute the light receptive sensor part 5, and an embedded channel area 10 and a second p-type semiconductor well area 11, which constitute the vertical transfer register 9, are formed.

And, an n-type semiconductor area 21 is formed below the $n^+$ semiconductor area 6 of the light receptive sensor part 5 so that it stretches over the first epitaxial layer 42 of the semiconductor substrate 43 and the second epitaxial layer 44 thereon.

The n-type semiconductor area 21 is formed upward of the p-type semiconductor well area 3 that becomes the overflow barrier.

Since the other configuration is similar to that of the CCD solid-state pickup element of FIG. 1, the same reference numbers are given thereto, and overlapping description thereof is omitted.

According to the CCD solid-state pickup element 41 of the above-described embodiment, since the n-type semiconductor area 21 is formed below the $n^+$ semiconductor area 6 that becomes the charge accumulating area of the light receptive sensor part 5, so that it stretches the first epitaxial layer 42 of the semiconductor substrate 43 and the second epitaxial layer 44 thereon, it is possible to deeply widen the charge collecting area 13 to the semiconductor substrate 43 as in the CCD solid-state pickup elements 1, 31 according to the preceding embodiments.

Therefore, conventionally wasted charge that has been photo-electrically converted in a deep position can be accumulated in the charge accumulating area, and the sensitivity can be improved.

Further, it is possible to attempt to reduce the pixel size of the CCD solid-state pickup element 41.

The CCD solid-state pickup element 41 according to the embodiment can be produced as shown below.

Figure 8A:
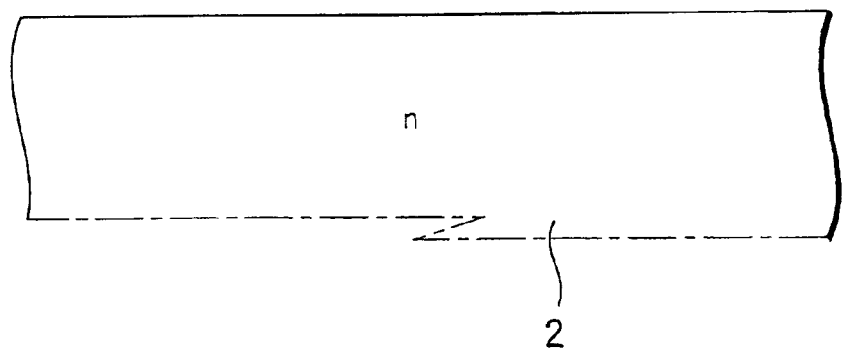
FIG. 8A and FIG. 8B are views showing the processes of producing the CCD solid-state pickup element of FIG. 7.

First, as shown in FIG. 8A, a semiconductor substrate 2 made of, for example, an n-type silicon, is prepared.

Figure 8B:
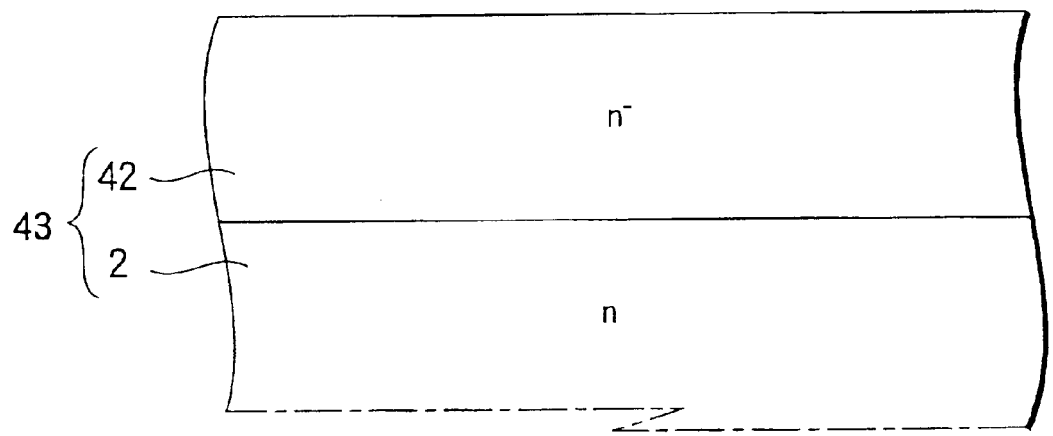

Next, as shown in FIG. 8B, the first epitaxial layer 42 of n-type low concentration is formed on the n-type semiconductor substrate 2, whereby a semiconductor substrate 43 including a semiconductor substrate 2 and a first epitaxial layer 42 is constituted.

Figure 9C:
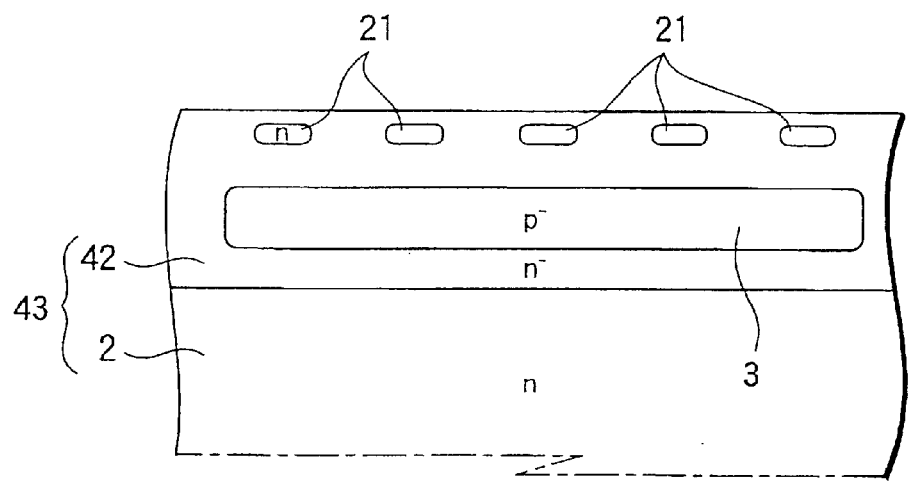
FIG. 9C and FIG. 9D are views showing the processes of producing the CCD solid-state pickup element of FIG. 7.

Subsequently, as shown in FIG. 9C, a p-type semiconductor well area 3 that becomes an overflow barrier area is formed in the first epitaxial layer 42, and an n-type semiconductor area 21 is formed close to the surface of the semiconductor substrate 43, that is, close to the surface of the first epitaxial layer 42.

Figure 9D:
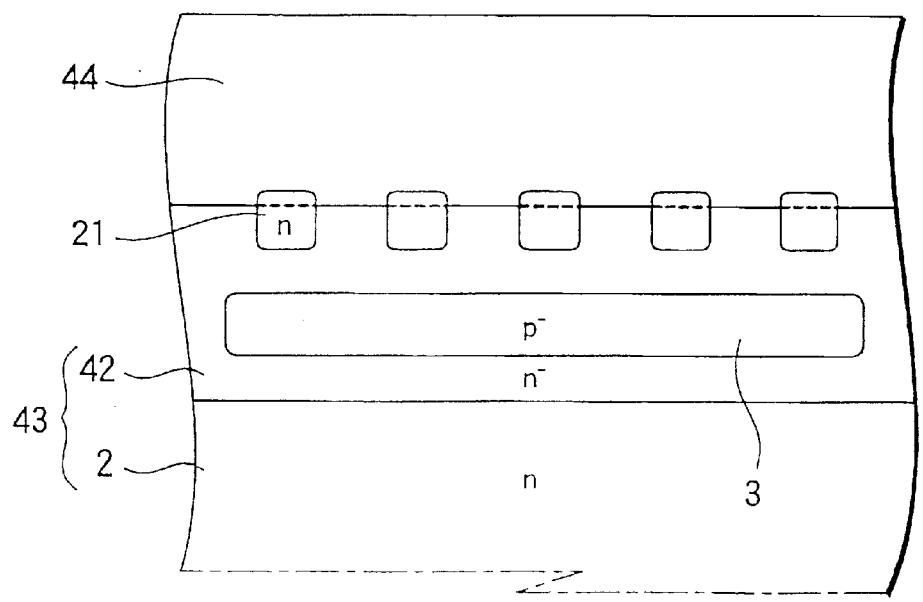
Figure 11:
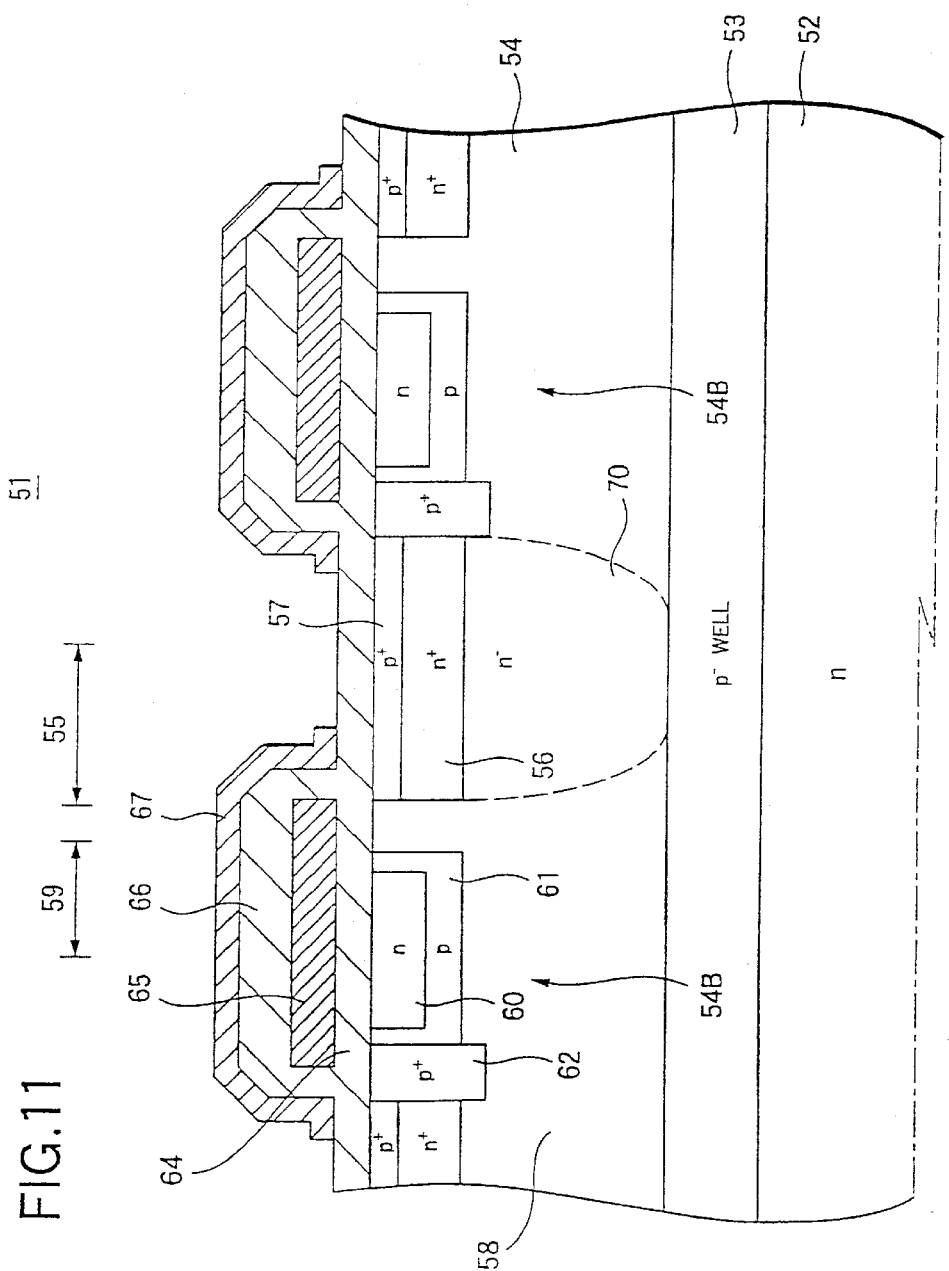
FIG. 11 is a general configurational view (sectional view) of a prior art CCD solid-state pickup element.

Further, as shown in FIG. 9D, the second epitaxial layer 44 is formed on the semiconductor substrate 43. At this time, the n-type semiconductor area 21 is diffused so as to stretch over the second epitaxial layer 44.

However, where the film forming temperature of the second epitaxial layer 44 is lowered, the n-type semiconductor area 21 may remain in the semiconductor substrate 43 even if it is diffused.

Thereafter, an area that constitutes a light receptive sensor part 5 and a vertical transfer register 9, etc., is formed on the second epitaxial layer 44 by ion-injection, and by forming a transfer electrode 15 and a light shielding film 17 upward of the second epitaxial layer 44, a CCD solid-state pickup element 41 shown in FIG. 7 can be produced.

In the respective above-described embodiments, by deeply forming the n-type semiconductor area 21 below the photo diode of the light receptive sensor part 5, the charge collecting area 20 could be widened.

But, as the pixel size is reduced on the other hand, the potential barrier is lowered between pixels in the vertical transfer direction. An improvement of the point is described below.

FIG. 10 is a sectional view showing a case where a channel stop area is formed in the CCD solid-state pickup element 1 of FIG. 1. This drawing shows a section of a pixel in the vertical transfer direction.

By ion-injection of, for example, B (Boron) into the area between pixels, a p-type impurity area is formed, and the p-type second channel stop area 22 is formed below the channel stop area 12. The second channel stop area 22 is formed at almost the same depth of that of the n-type semiconductor area 21 formed below the charge accumulating area 6 of the light receptive sensor part 5, that is, the depth of stretching over the semiconductor substrate 22 and the epitaxial layer 4.

If the second channel stop area 22 is formed on the semiconductor substrate 2 by ion-injection prior to the film formation of a low concentration epitaxial layer 4 as in the n-type semiconductor area 21, it can be easily formed.

Also, it does not matter even if the depth of the second channel stop area 22 may differ more or less from that of the n-type semiconductor area 21. For example, with respect to the CCD solid-state pickup element 1 of FIG. 1, it is also possible that the second channel stop area 22 is formed on only the semiconductor substrate 2 or on only the epitaxial layer 4.

In addition, regarding the ion injection into the three areas, the overflow barrier area 3, n-type semiconductor area 21, and second channel stop area 22, the order of injection is not particularly limited. Either of them may be carried out before the epitaxial layer 4 is formed.

According to the embodiments, since the second channel stop area 22 is formed below the channel stop area 12 between pixels, a sufficiently high potential barrier is formed between the pixels, and it is possible to securely separate the respective pixels.

Therefore, leakage of charge into adjacent pixels and/or mixing of charge can be prevented from occurring.

Also, with respect to the CCD solid-state pickup element 25 shown in FIG. 3, CCD solid-state pickup element 31 shown in FIG. 4 and CCD solid-state pickup element 41 shown in FIG. 7, the second channel stop area 22 is formed below the channel stop area 12 between pixels, and the pixels can be separated without fail.

In the above-described embodiments, a HAD (Hole Accumulation Diode) sensor having a p$^+$ positive charge accumulating area 7 has been constructed as a light receptive sensor part 5. However, the present invention is applicable to cases where the light receptive sensor part 5 is constructed of, for example, an n$^+$ semiconductor area 6, n$^-$ semiconductor area 10, which do not have any p$^+$ positive charge accumulating area 7, and a photo diode made of the first p-type semiconductor well area 3.

The above-described respective embodiments refer to the cases where the invention is applied to a CCD solid-state pickup element. However, the invention is applicable to a solid-state pickup element of the other construction.

For example, in a case where the invention is applied to, for example, a MOS type solid-state pickup element, the second conductive type semiconductor well area that becomes an overflow barrier area is formed in the semiconductor substrate to form a vertical type overflow drain structure, an epitaxial layer is formed on the semiconductor substrate. Furthermore, the first conductive type semiconductor area is formed at the position corresponding to the light receptive sensor part of the semiconductor substrate, whereby similarly, it is possible to widen the charge collecting area deeply close to the overflow barrier area.

The invention is not limited to the respective embodiments. But, it may be subject to various modifications within the scope not departing from the spirit of the invention.

What is claimed is:

1. A method for producing a solid-state imaging element, comprising:

forming an overflow barrier area in a semiconductor substrate of a first conductivity type;

forming a semiconductor area of the first conductivity type on a surface of said semiconductor substrate;

forming an epitaxial layer on said semiconductor substrate; and forming an electric charge collecting area of the first conductivity type at a position on said semiconductor area, wherein an impurity concentration of said semiconductor area is higher than that of said electric charge collection area.

2. The method for producing a solid-state imaging element according to claim 1, wherein said overflow barrier area includes a p-type semiconductor and said semiconductor area includes an n-type semiconductor.

3. The method for producing a solid-state imaging element according to claim 1, further comprising:

forming a charge accumulating area on said charge collecting area.

4. The method for producing a solid-state imaging element according to claim 1, wherein forming said epitaxial layer is after forming said semiconductor area.

5. The method for producing a solid-state imaging element according to claim 1, wherein said semiconductor area is included in said electric charge collecting area.

6. A method for producing a solid-state imaging element, comprising:

forming an overflow barrier area at a position in a semiconductor substrate of a first conductivity type;

forming an epitaxial layer on said semiconductor substrate;

forming matrix-arrayed light receptive sensor parts on a surface of said epitaxial layer by forming a first semiconductor area of said first conductivity type with a positive charge accumulating area formed thereon;

forming a charge collecting area in said epitaxial layer below said first semiconductor area of said first conductivity type and reaching said overflow barrier area; and forming a second semiconductor area of said first conductivity type at a position in said charge collecting area upward of said overflow barrier area and below said charge accumulating area.

7. The method of claim 6, wherein said second semiconductor area is formed partially within said semiconductor substrate and partially within said epitaxial area.

8. The method of claim 6, wherein a concentration of said second semiconductor area is less than that of said charge accumulating area.

9. The method of claim 8, wherein a concentration of said second semiconductor area is not more than half a concentration of said charge accumulating area, but more than a concentration of said first semiconductor area.

10. The method of claim 6, wherein said first semiconductor area has a greater concentration than that of said epitaxial layer.

11. The method of claim 6, wherein said second semiconductor area is formed wholly within said semiconductor substrate.

12. A method for producing a solid-state imaging element, comprising:

forming an overflow barrier area at a position in a semiconductor substrate of a first conductivity type;

forming a first epitaxial layer on said semiconductor substrate;

forming a second epitaxial layer on said first epitaxial layer;

forming matrix-arrayed light receptive sensor parts on a surface of said second epitaxial layer by forming said first semiconductor area of a first conductivity type with a positive charge accumulating area formed thereon;

forming a charge collecting area in said second epitaxial layer below said first semiconductor area of said first conductivity type and reaching said overflow barrier area; and forming a second semiconductor area of said first conductivity type at a position in said charge collecting area upward of said overflow barrier area and below said charge accumulating area.

13. The method of claim 12, wherein said second semiconductor area is formed below said charge accumulating area and over said first epitaxial layer.

14. The method of claim 13, wherein said second semiconductor area is diffused so as to stretch over said second epitaxial area.

15. The method of claim 6, wherein said overflow barrier are is formed within said first epitaxial layer.

16. A method for producing a solid-state imaging element, comprising:

forming an overflow barrier area at a position in a semiconductor substrate of a first conductivity type;

forming an epitaxial layer on said semiconductor substrate;

forming matrix-arrayed light receptive sensor parts on a surface of said epitaxial layer by forming a first semiconductor area of said first conductivity type with a positive charge accumulating area formed thereon;

forming a second semiconductor area of said first conductivity type at a position upward of said overflow barrier area and below said charge accumulating area;

forming a first channel stop area proximate a charge accumulating area and below said light receptive sensor parts; and forming a second channel stop below said first channel stop at a same depth as said second semiconductor area.

* * * * *